United States Patent
Fishman et al.

(10) Patent No.: US 9,350,166 B2
(45) Date of Patent: May 24, 2016

(54) HIGH VOLTAGE ENERGY HARVESTING AND CONVERSION RENEWABLE ENERGY UTILITY SIZE ELECTRIC POWER SYSTEMS AND VISUAL MONITORING AND CONTROL SYSTEMS FOR SAID SYSTEMS

(71) Applicants: Oleg S. Fishman, Maple Glen, PA (US); Ulrich K. W. Schwabe, Norristown, PA (US)

(72) Inventors: Oleg S. Fishman, Maple Glen, PA (US); Ulrich K. W. Schwabe, Norristown, PA (US)

(73) Assignee: ALENCON ACQUISITION CO., LLC, Hatboro, PA (US)

( * ) Notice: Subject to any disclaimer, the term of this patent is extended or adjusted under 35 U.S.C. 154(b) by 160 days.

(21) Appl. No.: 13/892,271

(22) Filed: May 11, 2013

(65) Prior Publication Data

US 2013/0249300 A1 Sep. 26, 2013

Related U.S. Application Data

(63) Continuation-in-part of application No. 13/253,629, filed on Oct. 5, 2011.

(60) Provisional application No. 61/389,816, filed on Oct. 5, 2010, provisional application No. 61/485,384, filed on May 12, 2011.

(51) Int. Cl.
*H02J 1/00* (2006.01)
*H01L 31/02* (2006.01)
(Continued)

(52) U.S. Cl.
CPC ............. *H02J 1/00* (2013.01); *H01L 31/02016* (2013.01); *H01L 31/02021* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 3,611,085 | A | 10/1971 | Rosenberry, Jr. |
| 3,628,123 | A | 12/1971 | Rosa |

(Continued)

FOREIGN PATENT DOCUMENTS

| | | |
|---|---|---|
| EP | 2276137 A2 | 1/2011 |
| JP | 2001-359239 A | 12/2001 |

(Continued)

OTHER PUBLICATIONS

Komkrit Chomsuwan, Photovoltaic Grid-Conneted Inverter Using Two-Switch Buck-Boost Converter, 2002, pp. 1527-1530, IEEE.

*Primary Examiner* — Jared Fureman
*Assistant Examiner* — Aqeel Bukhari
(74) *Attorney, Agent, or Firm* — Philip O. Post

(57) ABSTRACT

A renewable energy, utility-size electric power system is provided with a high voltage, renewable energy harvesting network connected by a direct current link to a centralized grid synchronized multiphase regulated current source inverter system. The harvesting network includes distributed renewable energy power optimizers and transmitters that control delivery of renewable energy to the grid synchronized multiphase regulated current source inverter system by step-up voltage boost of the DC voltage from the renewable energy sources in combination with a DC-to-DC conversion where the stepped-up voltage of the renewable sources is utilized as a positive high voltage DC output across the input of an inverter used in a DC-to-DC converter to establish an equal magnitude negative high voltage DC output across a rectified output of the inverter. A visual immersion monitoring and control system can be provided for a three-dimensional, visually-oriented, virtual reality display, and command and control environment.

20 Claims, 11 Drawing Sheets

(51) Int. Cl.
*H02J 3/38* (2006.01)
*H02J 3/46* (2006.01)

(52) U.S. Cl.
CPC .............. *H02J3/383* (2013.01); *H02J 3/386*
(2013.01); *H02J 3/46* (2013.01); *Y02E 10/563*
(2013.01); *Y02E 10/763* (2013.01); *Y10T*
*307/707* (2015.04)

(56) References Cited

U.S. PATENT DOCUMENTS

| | | | |
|---|---|---|---|
| 3,792,286 | A | 2/1974 | Meier |
| 3,876,923 | A | 4/1975 | Humphrey et al. |
| 3,979,662 | A | 9/1976 | Klein |
| 4,053,820 | A | 10/1977 | Peterson et al. |
| 4,204,264 | A | 5/1980 | Lipman |
| 4,224,660 | A | 9/1980 | Mohan |
| 4,225,914 | A | 9/1980 | Hirata et al. |
| 4,366,532 | A | 12/1982 | Rosa et al. |
| 4,445,049 | A | 4/1984 | Steigerwald |
| 4,581,573 | A | 4/1986 | Dobsa et al. |
| 4,680,690 | A | 7/1987 | Dickerson |
| 4,707,777 | A | 11/1987 | Cho |
| 4,750,098 | A | 6/1988 | Heinrich et al. |
| 4,779,181 | A | 10/1988 | Traver et al. |
| 4,870,557 | A | 9/1989 | Stacey |
| 4,953,071 | A | 8/1990 | Lipman |
| 4,975,822 | A | 12/1990 | Lipman |
| 5,065,303 | A | 11/1991 | Nguyen et al. |
| 5,168,437 | A | 12/1992 | Gyugyi et al. |
| 5,682,303 | A | 10/1997 | Goad |
| 5,892,664 | A | 4/1999 | Vedder |
| 6,166,527 | A | 12/2000 | Dwelley et al. |
| 6,169,676 | B1 | 1/2001 | Dahler et al. |
| 6,259,017 | B1 | 7/2001 | Takehara et al. |
| 6,340,851 | B1 | 1/2002 | Rinaldi et al. |
| 6,563,718 | B1 | 5/2003 | Li et al. |
| 7,576,449 | B2 | 8/2009 | Becker et al. |
| 7,672,149 | B2 | 3/2010 | Falk |
| 7,929,325 | B2 | 4/2011 | de Rooij et al. |
| 7,965,088 | B2 | 6/2011 | Thorngreen et al. |
| 8,344,549 | B2 | 1/2013 | Loh et al. |
| 2003/0227172 | A1 | 12/2003 | Erdman et al. |
| 2005/0275386 | A1 | 12/2005 | Jepsen et al. |
| 2007/0133241 | A1* | 6/2007 | Mumtaz et al. ............... 363/131 |
| 2007/0217239 | A1 | 9/2007 | Rottger et al. |
| 2008/0280175 | A1 | 11/2008 | Gurunathan et al. |
| 2008/0285317 | A1 | 11/2008 | Rotzoll |
| 2009/0102440 | A1 | 4/2009 | Coles |
| 2009/0140577 | A1 | 6/2009 | Fishman |
| 2009/0302686 | A1 | 12/2009 | Fishman |
| 2010/0013317 | A1 | 1/2010 | Ballantine et al. |
| 2010/0133911 | A1 | 6/2010 | Williams et al. |
| 2010/0156188 | A1* | 6/2010 | Fishman ...................... 307/77 |
| 2010/0301991 | A1 | 12/2010 | Sella et al. |
| 2010/0302819 | A1 | 12/2010 | O'Brien et al. |
| 2011/0310642 | A1* | 12/2011 | Dai et al. ...................... 363/37 |

FOREIGN PATENT DOCUMENTS

| | | | |
|---|---|---|---|
| JP | 2004-104963 | A | 4/2004 |
| KR | 1020080001828 | A | 1/2008 |
| WO | 2006/133714 | A1 | 12/2006 |
| WO | 2007/048420 | A1 | 5/2007 |
| WO | 2011033308 | A2 | 3/2011 |

* cited by examiner

HIGH VOLTAGE ENERGY HARVESTING AND CONVERSION RENEWABLE ENERGY UTILITY SIZE ELECTRIC POWER SYSTEMS AND VISUAL MONITORING AND CONTROL SYSTEMS FOR SAID SYSTEMS

CROSS REFERENCE TO RELATED APPLICATIONS

This application is a continuation-in-part of U.S. application Ser. No. 13/253,629 filed Oct. 5, 2011, which claims the benefit of U.S. Provisional Application No. 61/389,816, filed Oct. 5, 2010 and U.S. Provisional Application No. 61/485,384, filed May 12, 2011; and also claims priority to PCT International Patent Application No. PCT/US2012/37680, filed May 13, 2012, all of which applications are incorporated herein by reference in their entireties.

FIELD OF THE INVENTION

The present invention relates generally to renewable energy, utility-size electric power systems and, in particular, to high voltage energy harvesting and conversion renewable energy collection and conversion systems, and to visual monitoring and control systems for such systems where a combination of DC-to-DC converters are used.

BACKGROUND OF THE INVENTION

The term "renewable energy electric power systems" as used herein refers to utility-size electric power systems that utilize a large number of interconnected photovoltaic modules to form a solar farm or power plant, or a large number of interconnected wind turbine generators that form a wind farm or power plant.

Utility-size (ranging from 5 to 100 megawatt ($MW_e$) output capacity) solar photovoltaic power systems comprise a large number of solar photovoltaic power collectors, such as solar photovoltaic modules, that supply DC electric power to collocated DC to AC inverters that convert the DC power into AC electric power.

A utility-size wind power system comprises a large number of electrically interconnected wind turbine generators. A wind turbine driven generator assembly can be a wind turbine with its output shaft suitably coupled to an electric generator. Various types of generator systems can be coupled to a wind turbine. One such system is known as a Type 4 industry designated wind turbine generator power system where the generator is a synchronous permanent magnet generator having a variable frequency, variable voltage output that is supplied to a rectifier with the rectified output DC link supplied to a DC to AC inverter. The inverter output current is then transformed through a line transformer that transforms the inverter output voltage level to the grid voltage level.

For either a solar or wind renewable energy, utility-size power system, the power system components are spread out over significantly more land than a conventional residential or commercial size power plant thus making physical visualization and control of the power system a challenge beyond that of the typical one line centralized control boards used for conventional size power plants.

The following features may be present in apparatus and methods according to the invention:

monitoring and control systems for a high voltage, renewable energy harvesting network in combination with a centralized grid synchronized multiphase regulated current source inverter system wherein the renewable energy harvesting is distributively power optimized within the harvesting network by a combination of DC-to-DC converters;

high voltage energy harvesting in combination with a centralized grid synchronized multiphase regulated current source inverter system, and a visual monitoring and control system for a utility scale renewable energy system; and power collection, conversion, monitoring and control systems for renewable energy, utility-sized power systems that can include a three dimensional, visually-oriented, virtual reality display environment for centralized input and output control and monitoring of the power systems by the systems' operators.

BRIEF SUMMARY OF THE INVENTION

In one aspect the present invention is a renewable energy, utility-size electric power system. The system has a high voltage, renewable energy harvesting network and a centralized grid synchronized multiphase regulated current source inverter system. The high voltage, renewable energy harvesting network has multiple strings of renewable energy collectors, with each of the strings having a DC output, and multiple renewable energy power optimizers distributed throughout the harvesting network. Each renewable energy power optimizer has at least one energy collector string power optimizer input connected to the DC output of at least one of the multiple strings of renewable energy collectors. Each of the multiple renewable energy power optimizers and transmitters has a high voltage DC output connected to a DC link. The plurality of renewable energy power optimizers and transmitters are arranged in combinations that provide a single positive high voltage DC output, and a single negative high voltage DC output to the system DC link with a single electrical neutral connected to electrical ground of the system DC link. Power optimization is achieved by step-up voltage boost of the DC voltage from the renewable energy sources integral with a DC-to-DC conversion where the stepped-up voltage of the renewable sources is utilized as a positive high voltage DC output across the input of an inverter used in a DC-to-DC converter to establish an equal magnitude negative high voltage DC output across a rectified output of the inverter. Both positive and negative high voltage DC outputs are equalized and referenced to a common electrical ground so that the output to the system DC link is twice the absolute magnitude of either the positive or negative high voltage DC output. The centralized grid synchronized multiphase regulated current source inverter system is connected to the system DC link and has a plurality of grid inverter package modules that can be connected to a high voltage electrical grid.

In another aspect the present invention is a renewable energy, utility-size electric power system. The system has a high voltage, renewable energy harvesting network; a centralized grid synchronized multiphase regulated current source inverter system; and a virtual immersion monitoring system and central control system for monitoring and controlling the high voltage, renewable energy harvesting network and the centralized grid synchronized multiphase regulated current source inverter system. The high voltage, renewable energy harvesting network has a plurality of strings of renewable energy collectors, with each of the strings having a DC output, and a plurality of renewable energy power optimizers and transmitters. Each of the plurality of renewable energy power optimizers and transmitters has at least one string power optimizer input connected to the DC output of at least one of the plurality of strings of renewable energy collectors. The plurality of renewable energy power optimizers and transmitters are arranged in combinations that provide a single positive high voltage DC output, and a single negative high voltage DC output to the system DC link with a single electrical neutral connected to electrical ground of the system DC link. Power optimization is achieved by step-up voltage boost of the DC voltage from the renewable energy sources integral with a DC-to-DC conversion where the stepped-up voltage of the renewable sources is utilized as a positive high voltage DC output across the input of an inverter used in a DC-to-DC converter to establish an equal magnitude negative high voltage DC output across a rectified output of the inverter. Both positive and negative high voltage DC outputs are equalized and referenced to a common electrical ground so that the output to the system DC link is twice the absolute magnitude of either the positive or negative high voltage DC output. The grid synchronized multiphase regulated current source inverter system is connected to the DC link and has a plurality of grid inverter package modules.

In another aspect the present invention is a method of harvesting, converting, monitoring and controlling renewable energy from a utility scale renewable energy system. The renewable energy system includes a high voltage, renewable energy harvesting network. The harvesting network includes a plurality of strings of renewable energy collectors, with each of the plurality of renewable energy collectors having a DC output. The harvesting network also includes a plurality of renewable energy power optimizers and transmitters. Each of the plurality of renewable energy power optimizers and transmitters has at least one string power optimizer input connected to the DC output of at least one of the plurality of strings of renewable energy collectors. Each of the plurality of renewable energy power optimizers and transmitters are arranged in combinations that provide a single positive high voltage DC output, and a single negative high voltage DC output to the system DC link with a single electrical neutral connected to electrical ground of the system DC link. Power optimization is achieved by step-up voltage boost of the DC voltage from the renewable energy sources integral with a DC-to-DC conversion where the stepped-up voltage of the renewable sources is utilized as a positive high voltage DC output across the input of an inverter used in a DC-to-DC converter to establish an equal magnitude negative high voltage DC output across a rectified output of the inverter. Both positive and negative high voltage DC outputs are equalized and referenced to a common electrical ground so that the output to the system DC link is twice the absolute magnitude of either the positive or negative high voltage DC output. The renewable energy system also includes a centralized grid synchronized multiphase regulated current source inverter system that is connected to the system DC link and has a plurality of grid inverter package modules. In the present invention, virtual immersion monitoring of the high voltage, renewable energy harvesting network is performed in a three dimensional, visually-oriented, virtual reality display environment, and the high voltage, renewable energy harvesting network and the centralized grid synchronized multiphase regulated current source inverter system is centrally controlled in communication with the three dimensional visually-oriented virtual reality display environment.

The above and other aspects of the invention are further set forth in this specification and the appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 1:
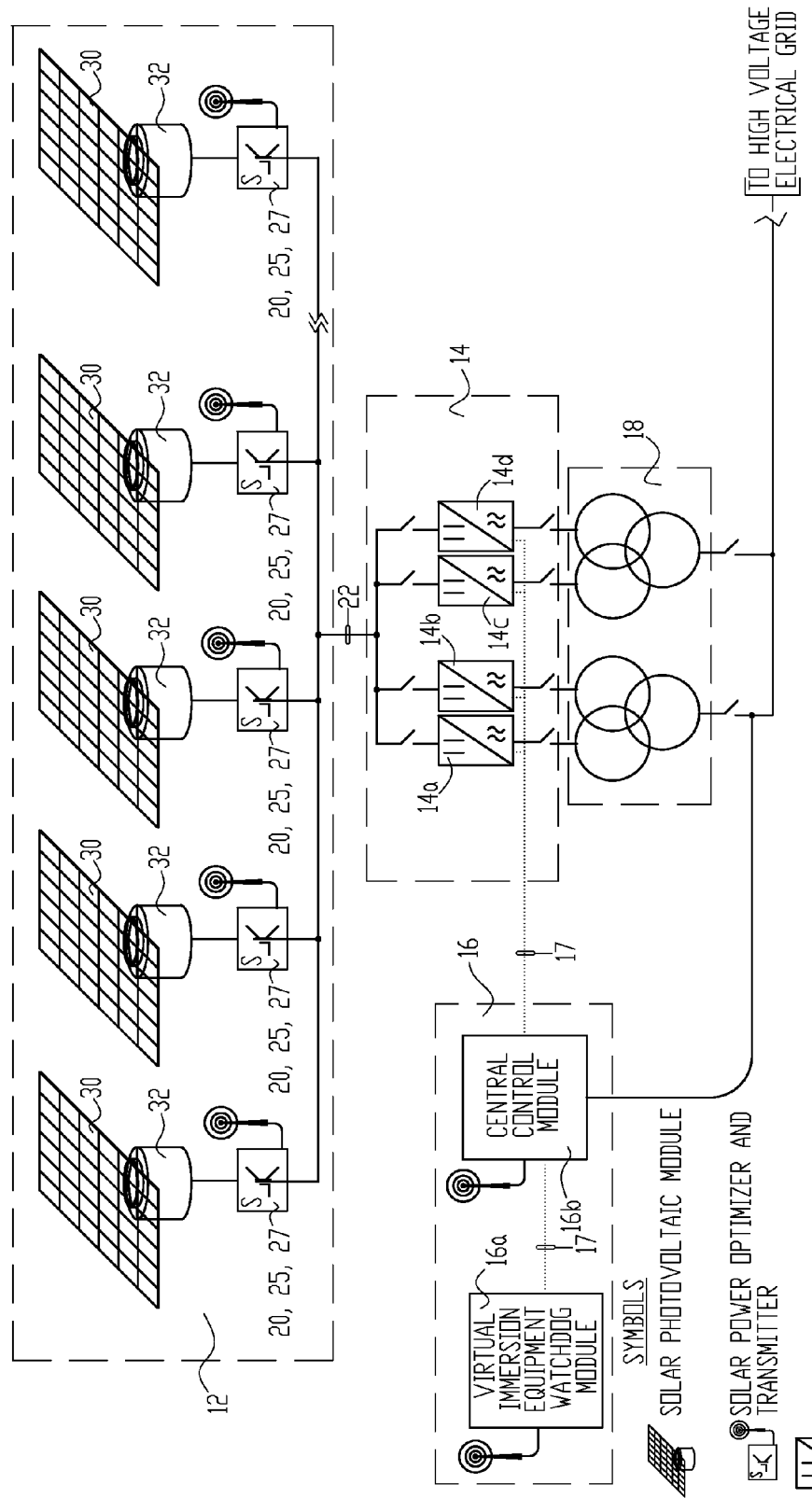
FIG. 1 is a simplified one-line block diagram of one example of a renewable energy, utility-size electric power system for the collection and conversion of solar energy, and a monitoring and control system of the present invention for the power system.

FIG. 1 is a simplified one-line block diagram of one example of a renewable energy, utility-size electric power system for the collection and conversion of solar energy, and a monitoring and control system of the present invention for the power system. In this example, there is a high voltage, solar photovoltaic energy collection (also referred to as "harvesting") network 12; a centralized grid synchronized multiphase regulated current source inverter system 14; and an optional virtual immersion monitoring and control system 16. Step-up transformer 18 electrically isolates the outputs of the inverters in the grid inverter package (GrIP) modules 14a-14d from the high voltage electrical grid.

High voltage, solar photovoltaic energy harvesting networks and the centralized grid synchronized multiphase regulated current source inverter systems are further described in U.S. Pat. No. 8,130,518.

The virtual immersion monitoring and control system comprises the virtual immersion equipment watchdog (VIEW) module 16a and the central control module 16b.

Figure 2A:
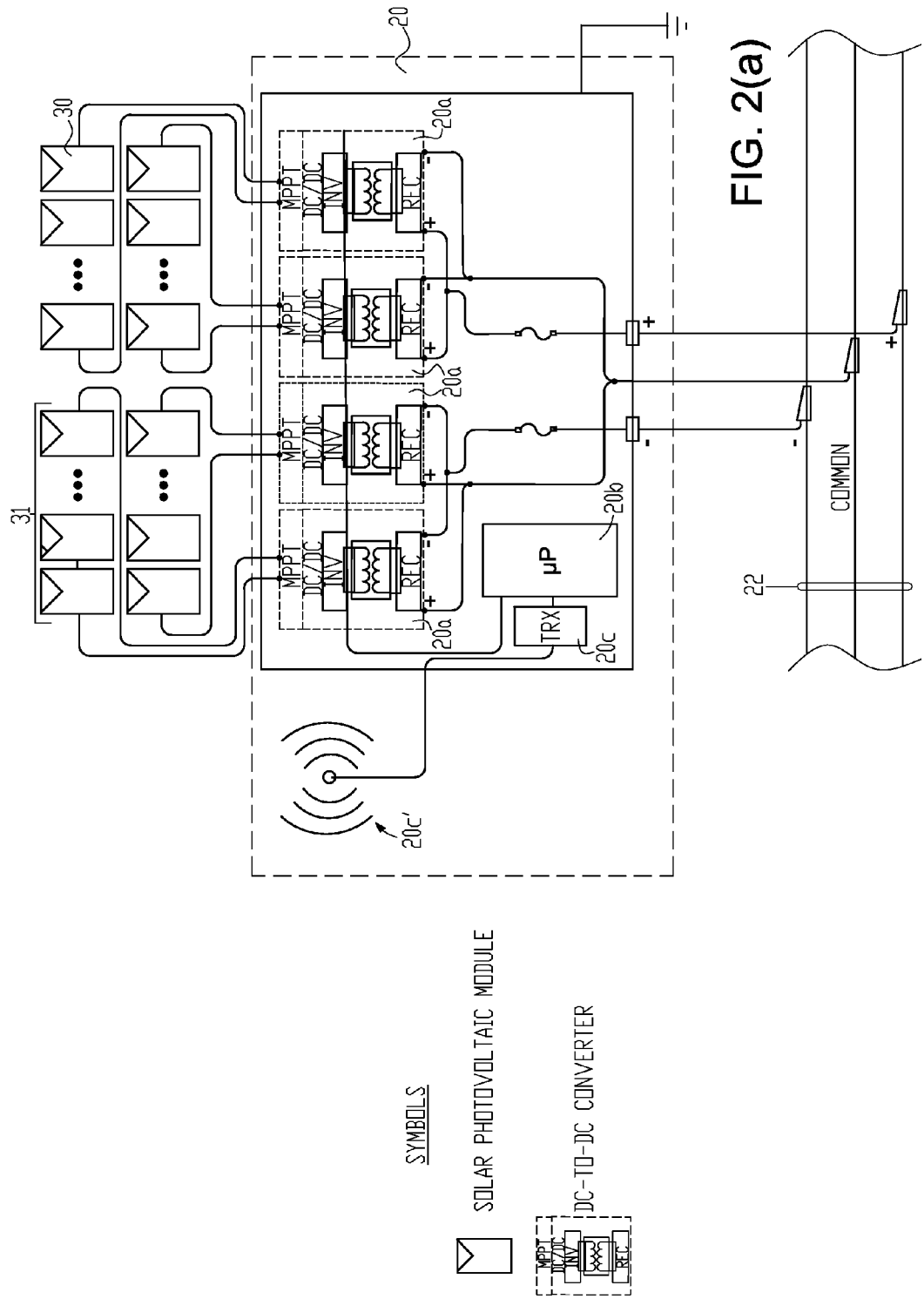
FIG. 2(a) is a diagram of one example of a solar power optimizer and transmitter that can be utilized in the present invention.

One example of a solar power optimizer and transmitter (SPOT) that can be utilized in the high voltage, solar photovoltaic energy collection network 12 in FIG. 1 is shown in FIG. 2(a). SPOT 20 in FIG. 2(a) comprises a plurality of DC-to-DC converters 20a (four in this example); processor 20b (represented as a microprocessor (µP) in this example); and transceiver 20c (represented as a radio frequency (RF) transceiver in this example with transmitting and receiving antenna 20c').

The four DC-to-DC converters in FIG. 2(a) convert variable photovoltaic "string" voltages and currents into parallel fixed high voltages (for example 1,250 volts DC). In this example positive (+) outputs of two of the converters are connected together in parallel and negative outputs (−) of the other two converters are connected together in parallel as shown in FIG. 2(a). The remaining four outputs of the four converters are connected commonly together as shown in FIG. 2(a) to form a common (neutral) circuit. The converters' paralleled positive and negative outputs are connected (clamped) in series to a system DC link (identified as DC link bus 22 in FIG. 1 and FIG. 2(a)) at a high DC voltage (for example, 2.5 kV DC) that is double the output voltage (for example, 1.25 kV DC) of each DC-to-DC converter. Reference is made back to one-line diagram FIG. 1 where a plurality of solar power optimizers and transmitters (as shown in FIG. 2(a)) may be connected to a plurality of solar photovoltaic modules 30. Therefore the combination of the four DC-to-DC converters in FIG. 2(a) can be described as a first pair of converters on the right side of the figure and a second pair of converters on the left side of the figure where the positive output connections of the first pair of converters form a single positive high voltage DC output; the negative output connections of the second pair of converters form a single negative high voltage DC output; and the negative output connections of the first pair of converters together with the positive output connections of the second pair of converters form a single neutral connection to the common of the system DC link. In other examples of the invention, any even number of DC-to-DC converters can be arranged with outputs interconnected to achieve the single positive high voltage DC output and single negative high voltage DC output with a single neutral connection to the system DC link similar to that described for the four DC-to-DC converter example.

Figure 3A:
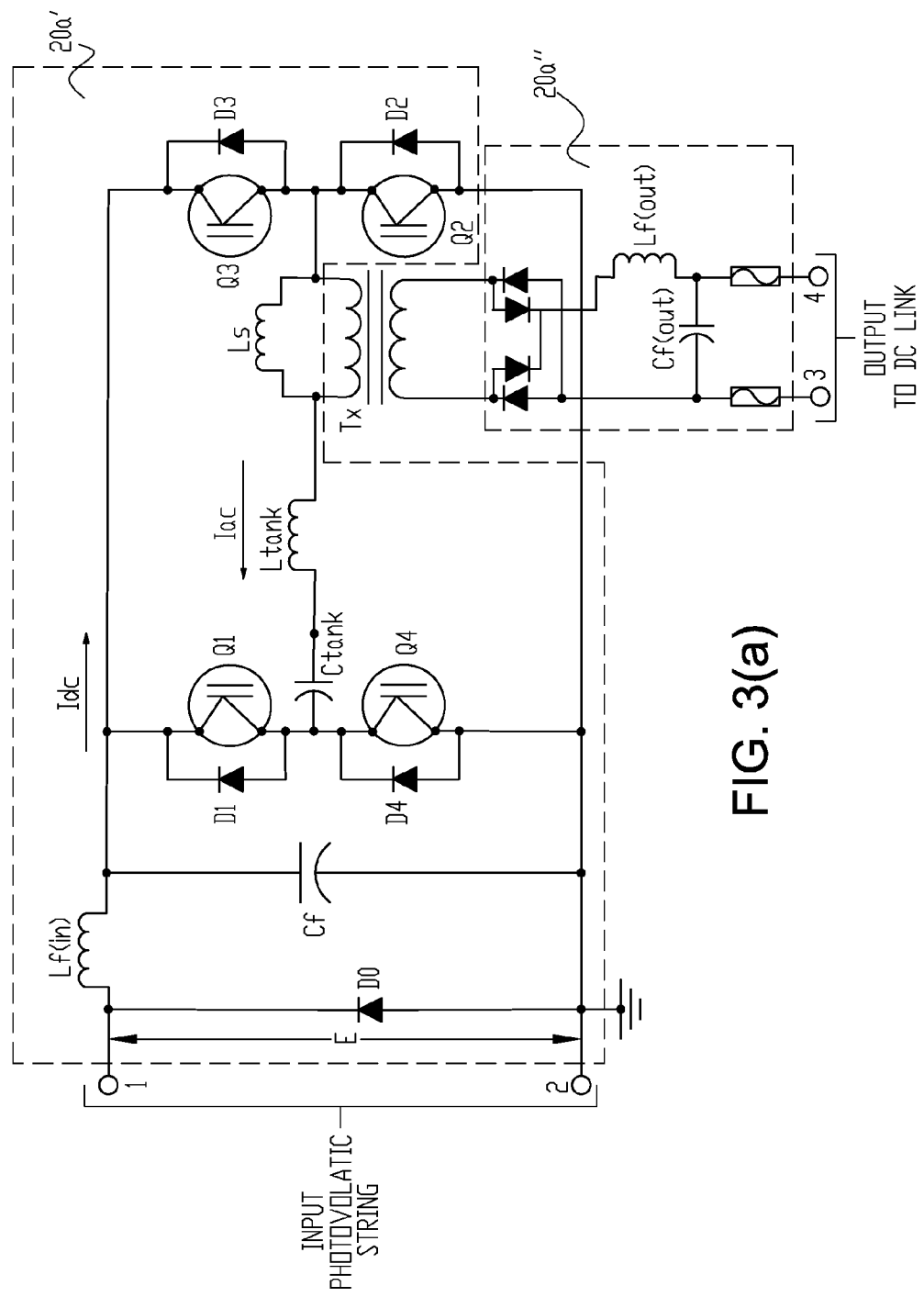
FIG. 3(a) is a diagram of one example of a resonant DC-to-DC converter that can be utilized in the solar power optimizer and transmitter shown in FIG. 2(a).
Figure 4:
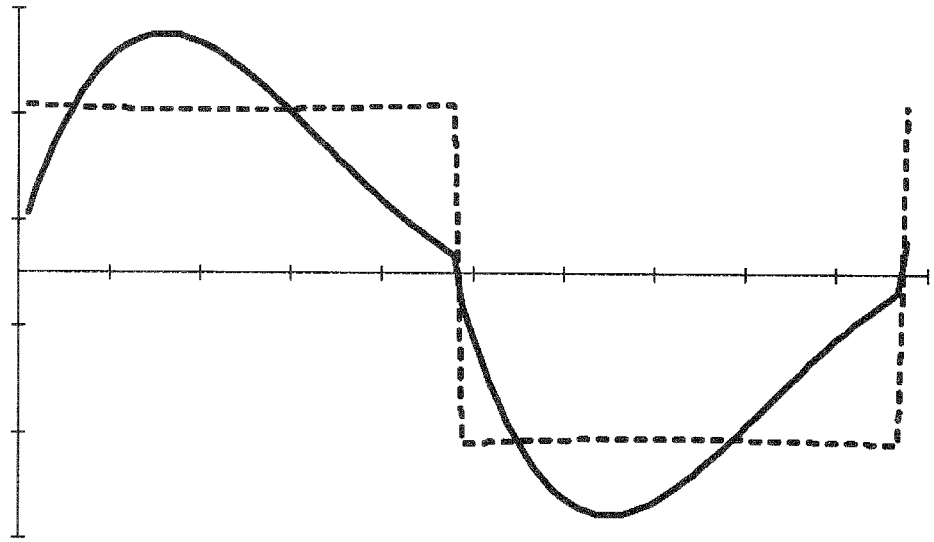
FIG. 4 illustrates the wave shape of the inverter current near resonance of the resonant DC-to-DC converter shown in FIG. 3 (a), FIG. 3(b) and FIG. 3(c) when the photovoltaic string voltage connected to the input of the DC-to-DC converter is low.
Figure 5:
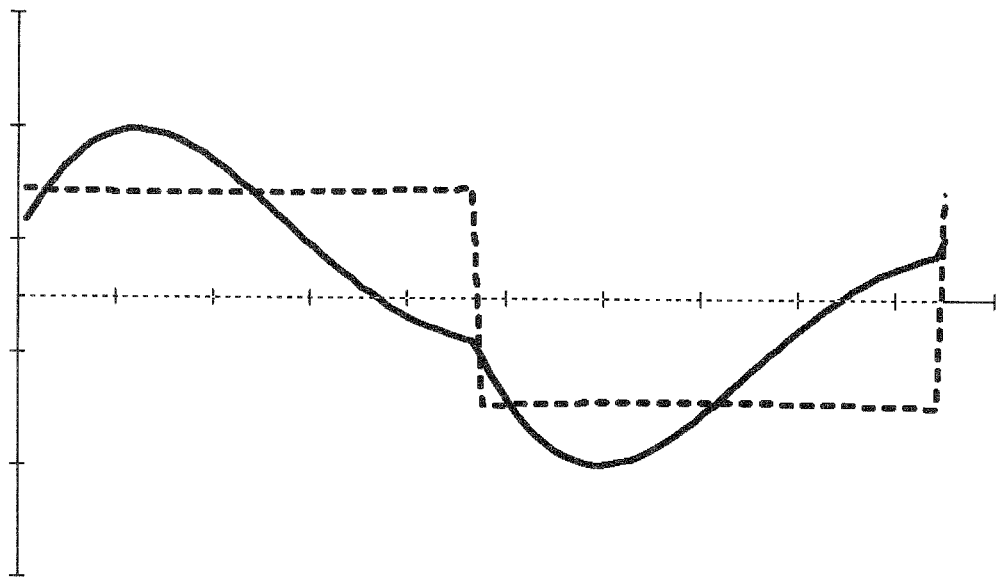
FIG. 5 illustrates the wave shape of the inverter current off-resonance of the resonant DC-to-DC converter shown in FIG. 3 (a), FIG. 3(b) and FIG. 3(c) when the photovoltaic string voltage connected to the input of the DC-DC converter is high.

FIG. 3(a) is one schematic example of a DC-to-DC converter that can be utilized in the solar power optimizer and transmitter 20 shown in FIG. 2(a). Each DC-to-DC converter consists of two sections: a series resonant full bridge inverter 20a' (shown with semiconductor switching devices Q1 through Q4 in this example) and a combination output filter and single rectifier section 20a". These are isolated from one another via a high frequency (in the range of 50 kHz to 100 kHz) transformer Tx. Power drawn from the input photovoltaic string source at terminals 1 and 2 varies with the operating frequency of the inverter. The input current (Idc) and voltage (E) are measured by processor 20b in FIG. 2(a) which processor adjusts the operating frequency of the inverter so that the DC-to-DC converter operates at the maximum power point value. The operating frequency of the converter's input inverter is varied near resonance, which is defined by the values of inductor Ltank and capacitor Ctank in FIG. 3(a) forming a series resonance loop. As the frequency approaches the resonance point, the inverter draws more current from the input photovoltaic string causing the photovoltaic string voltage to drop. As further described below, one of the functions of processor 20b is to maintain the mathematical product of the photovoltaic string voltage and current at the maximum power point value. FIG. 4 illustrates the inverter output current near resonance when the input photovoltaic string voltage can be low and FIG. 5 illustrates the inverter current off-resonance when the photovoltaic string voltage can be high.

Processor 20b may be a microprocessor in communication with I/O devices that sense the string voltage and current at the input to each DC-to-DC converter 20a. The processor monitors the string voltage and current at the input of each converter, and controls operation of each converter to harvest maximum power from each solar photovoltaic module string by executing computer code for a maximum power point tracking (MPPT) algorithm. For example, the algorithm may include "disturb and observe" subroutines by which the operating frequency of the DC-to-DC converter is varied by a small amount and the MPPT algorithm determines whether the harvested power increased or decreased with the frequency perturbation.

Transceiver 20c transmits power system data to the virtual immersion monitoring and control system if used in a particular example of the invention. The power system data can include: string voltage magnitudes; string current magnitudes; string power magnitudes; SPOT output current magnitudes; SPOT operating temperatures; and SPOT operational status data, such as whether the SPOT is operating at full maximum input power from all of the input photovoltaic strings, or limited maximum input power from at least some of the input photovoltaic strings. Transceiver 20c receives power system data that can include power system limit command data and power system ON or OFF status or control. Power system ON or OFF status can be determined, for example, by sensing whether a particular DC-to-DC converter is in an operational oscillation state (power system ON). Remote power system ON or OFF command (from the central control module) can be used to facilitate maintenance of a SPOT. One method of transceiver 20c transmitting and receiving is via a mesh radio system.

Figure 2B:
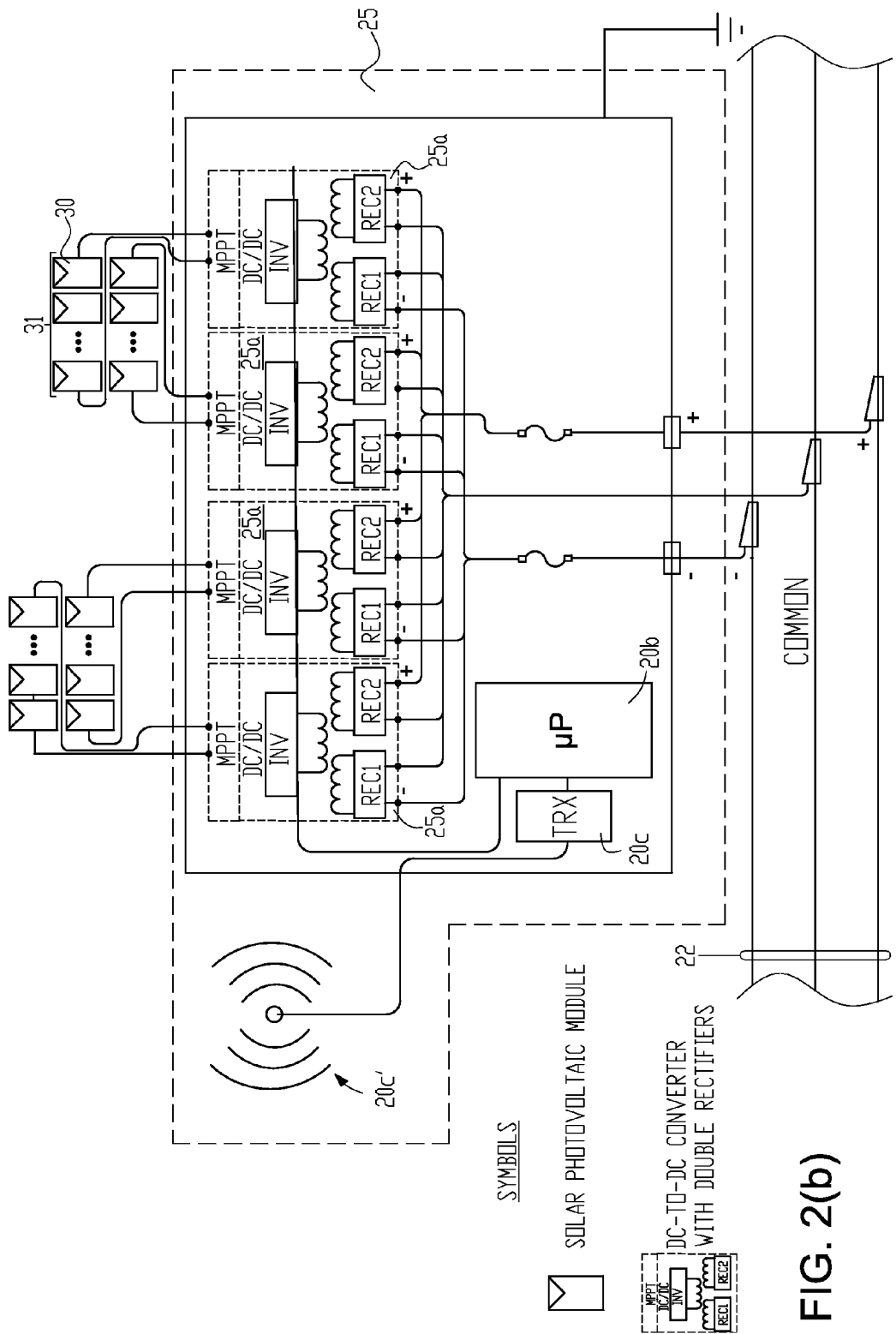
FIG. 2(b) is a diagram of another example of a solar power optimizer and transmitter that can be utilized in the present invention.

FIG. 2(b) illustrates an alternative solar power optimizer and transmitter (SPOT) utilized in some examples of high voltage, solar photovoltaic energy collection network 12 in FIG. 1. SPOT 25 in FIG. 2(b) comprises a plurality of double rectifier DC-to-DC converters 25a (four in this example); processor 20b (represented as a microprocessor (µP) in this example); and transceiver 20c (represented as a radio frequency (RF) transceiver in this example with transmitting and receiving antenna 20c').

The four double rectifier DC-to-DC converters in FIG. 2(b) convert variable photovoltaic "string" voltages and currents into parallel fixed high voltages (for example 1,250 volts DC). In this example four positive (+) outputs of the converters are connected together in parallel to form a connection to the positive DC link and four negative outputs (−) of the converters are connected together in parallel to form a connection to the negative DC link as shown in FIG. 2(b). The remaining eight outputs of the four converters are connected commonly together as shown in FIG. 2(b) to form a common connection to electrical neutral (COMMON). The converters' paralleled positive and negative outputs are connected (clamped) in parallel to a DC link (identified as DC link bus 22 in FIG. 1 and FIG. 2(b)) at a high DC voltage (for example, 2.5 kV DC) that is double the output voltage (for example, 1.25 kV DC) of each DC-to-DC converter. Reference is made back to one-line diagram FIG. 1 where a plurality of solar power optimizers and transmitters (as shown in FIG. 2(b)) may be connected to a plurality of solar photovoltaic modules 30. Therefore the combination of the four DC-to-DC converters in FIG. 2(b) can be described as a combination of four DC-to-DC converters with each of the converters having a pair of rectifiers that are designated as a positive rectifier (REC2) and a negative rectifier (REC1). The positive outputs of all of the positive rectifiers are connected together to form a single positive high voltage DC output; the negative outputs of all of the negative rectifiers are connected together to form a single negative high voltage DC output; and the negative connections of the positive rectifiers are connected together with the positive connections of the negative rectifiers to form a single neutral connection to the common of the system DC link. In other examples of the invention, any even number of DC-to-DC converters can be arranged with outputs interconnected to achieve the single positive high voltage DC output and single negative high voltage DC output with a single neutral connection to the system DC link similar to that described for the four DC-to-DC converter example.

Figure 3B:
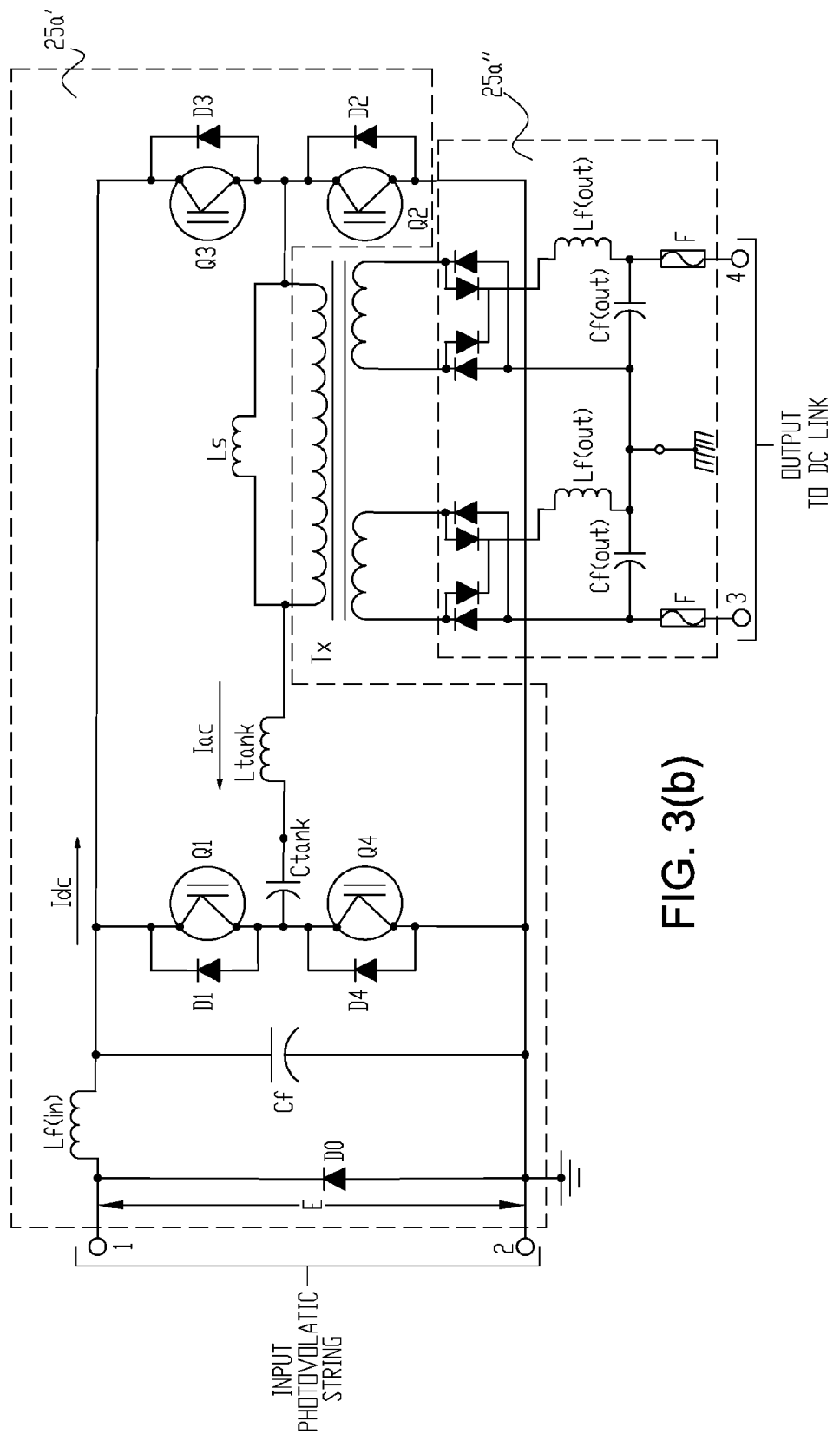
FIG. 3(b) is a diagram of one example of a resonant DC-to-DC converter that can be utilized in the solar power optimizer and transmitter shown in FIG. 2(b).

FIG. 3(b) is one schematic example of a double rectifier DC-to-DC converter that can be utilized in the solar power optimizer and transmitter 25 shown in FIG. 2(b). Each DC-to-DC converter consists of two sections: a series resonant full bridge inverter 25a' and a combination two output (double or paired) rectifier and filter sections 25a''. These are isolated from one another via a high frequency (in the range of 50 kHz to 100 kHz) transformer Tx. Power drawn from the input photovoltaic string source at terminals 1 and 2 varies with the operating frequency of the inverter. The input current (Idc) and voltage (E) are measured by processor 20b in FIG. 2(b) which processor adjusts the operating frequency of the inverter so that the DC-to-DC converter operates at the maximum power point value. The operating frequency of the converter's input inverter is varied near resonance, which is defined by the values of inductor Ltank and capacitor Ctank in FIG. 3(b) forming a series resonance loop. As the frequency approaches the resonance point, the inverter draws more current from the input photovoltaic string causing the photovoltaic string voltage to drop. As further described below, one of the functions of processor 20b is to maintain the mathematical product of the photovoltaic string voltage and current at the maximum power point value. FIG. 4 illustrates the inverter output current near resonance when the input photovoltaic string voltage can be low and FIG. 5 illustrates the inverter current off-resonance when the photovoltaic string voltage can be high.

Figure 2C:
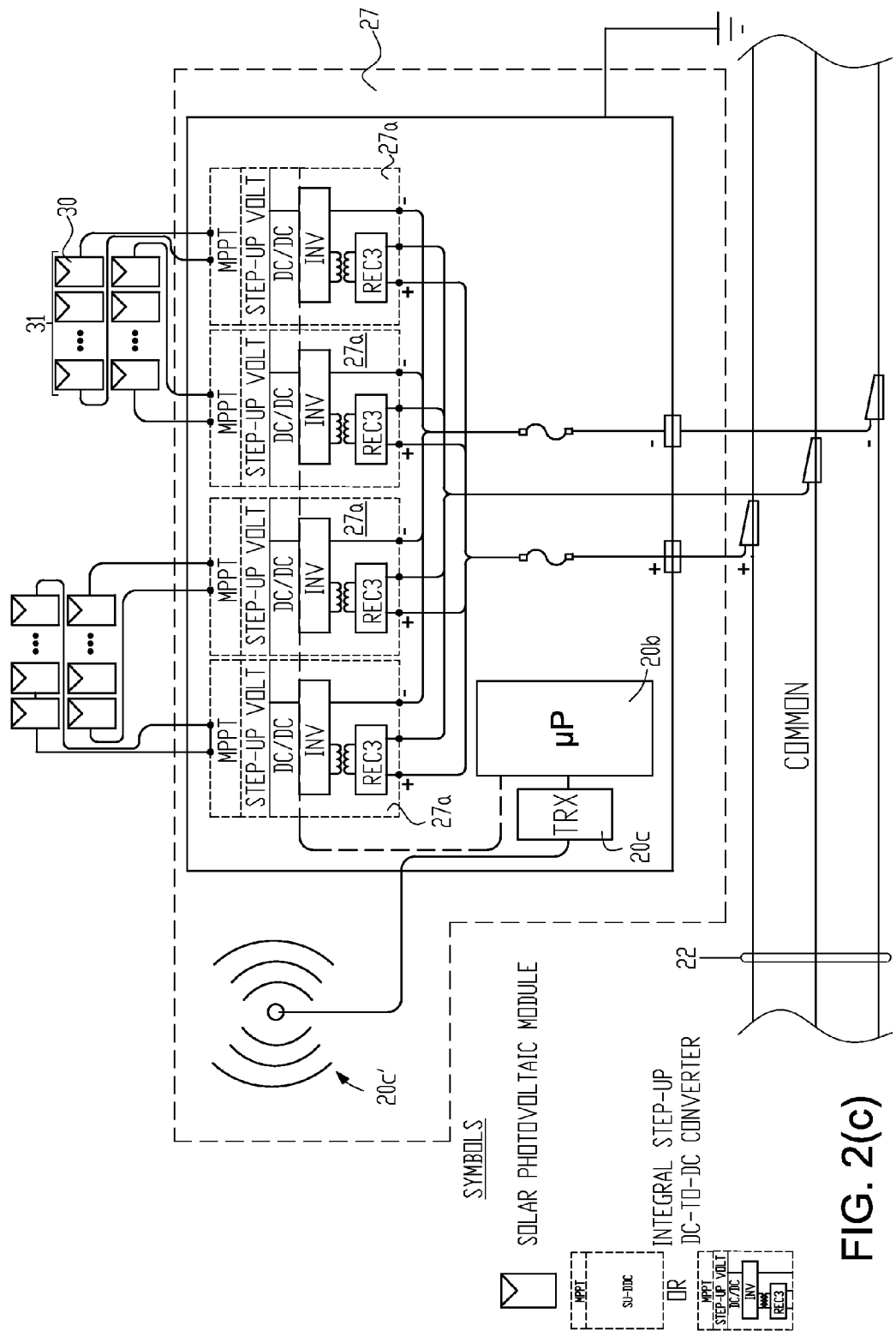
FIG. 2(c) is a diagram of another example of a solar power optimizer and transmitter that can be utilized in the present invention.

FIG. 2(c) illustrates an alternative solar power optimizer and transmitter (SPOT) utilized in some examples of high voltage, solar photovoltaic energy collection network 12 in FIG. 1. Each SPOT 27 in FIG. 2(c) comprises the combination of a step-up voltage regulator (STEP-UP VOLT) and a rectifier DC-to-DC (DC/DC) converter, which is referred to as an integral step-up DC-to-DC converter (SU-DDC). In the integral step-up DC-to-DC converter, the step-up voltage regular boosts the positive (+) voltage output at the SU-DDC positive output terminal to a stepped-up positive output voltage (maximum of +1.25 kV DC in this example). The rectifier DC-to-DC converter converts this stepped-up positive output voltage into an equal value negative voltage (maximum of −1.25 kV DC in this example) and applies it to the SU-DDC negative (−) output terminal. Similar to SPOT 25 in FIG. 2(b) and SPOT 20 in FIG. 2(a), SPOT 27 also includes processor 20b (represented as a microprocessor (μP) in this example); and transceiver 20c (represented as a radio frequency (RF) transceiver in this example with transmitting and receiving antenna 20c').

The four combination integral step-up DC-to-DC converters in FIG. 2(c) convert variable photovoltaic "string" voltage and current sources into parallel fixed high voltage sources (for example 1.25 kV DC). In this example the four positive (+) outputs of each of the four integral step-up DC-to-DC converters are connected together in parallel to form a connection to the positive system DC link and the four negative outputs (−) of each one of the four integral step-up DC-to-DC converters are connected together in parallel to form a connection to the negative system DC link as shown in FIG. 2(c). The remaining four outputs of each of the four integral step-up DC-to-DC converters are connected commonly together as shown in FIG. 2(c) to form a common neutral connection to the common of the system DC link. The converters' paralleled positive and negative outputs are connected (clamped) in parallel to a system DC link (identified as DC link bus 22 in FIG. 1 and FIG. 2(c)) at a high DC voltage level that is double either the positive or negative output voltage level (maximum of plus or minus 1.25 kV respectively in this example) of each SU-DDC, namely a double nominal voltage of 2.5 kV DC in this example. Reference is made back to one-line diagram FIG. 1 where a plurality of solar power optimizers and transmitters (as shown in FIG. 2(c)) may be connected to a plurality of solar photovoltaic modules 30. Therefore the combination of the four integral step-up DC-to-DC converters in FIG. 2(c) can be described as a combination of four integral step-up DC-to-DC converters with each of the integral step-up DC-to-DC converters having a DC-to-DC converter rectified negative output referenced to an electrical ground connection (zero voltage reference level), and a positive output referenced to the electrical ground connection. The positive outputs of all of the integral step-up DC-to-DC converters are connected together in parallel to form a single positive high voltage DC output; the negative outputs of all of the integral step-up DC-to-DC converters are connected together in parallel to form a single positive high voltage DC output; and the electrical ground connections of all the integral step-up DC-to-DC converters are connected together in parallel to form a single neutral connection to the common of the system DC link.

In other examples of the invention, one or more of the integral step-up DC-to-DC converters can be utilized as a single power optimizer. For any multiple arrangements of integral step-up DC-to-DC converters used as a single power optimizer outputs of the multiple integral step-up DC-to-DC converters are interconnected to achieve the single positive high voltage DC output and single negative high voltage DC output with a single neutral connection to the system DC link similar to that described for the four integral step-up DC-to-DC converter example of a power optimizer.

Figure 3C:
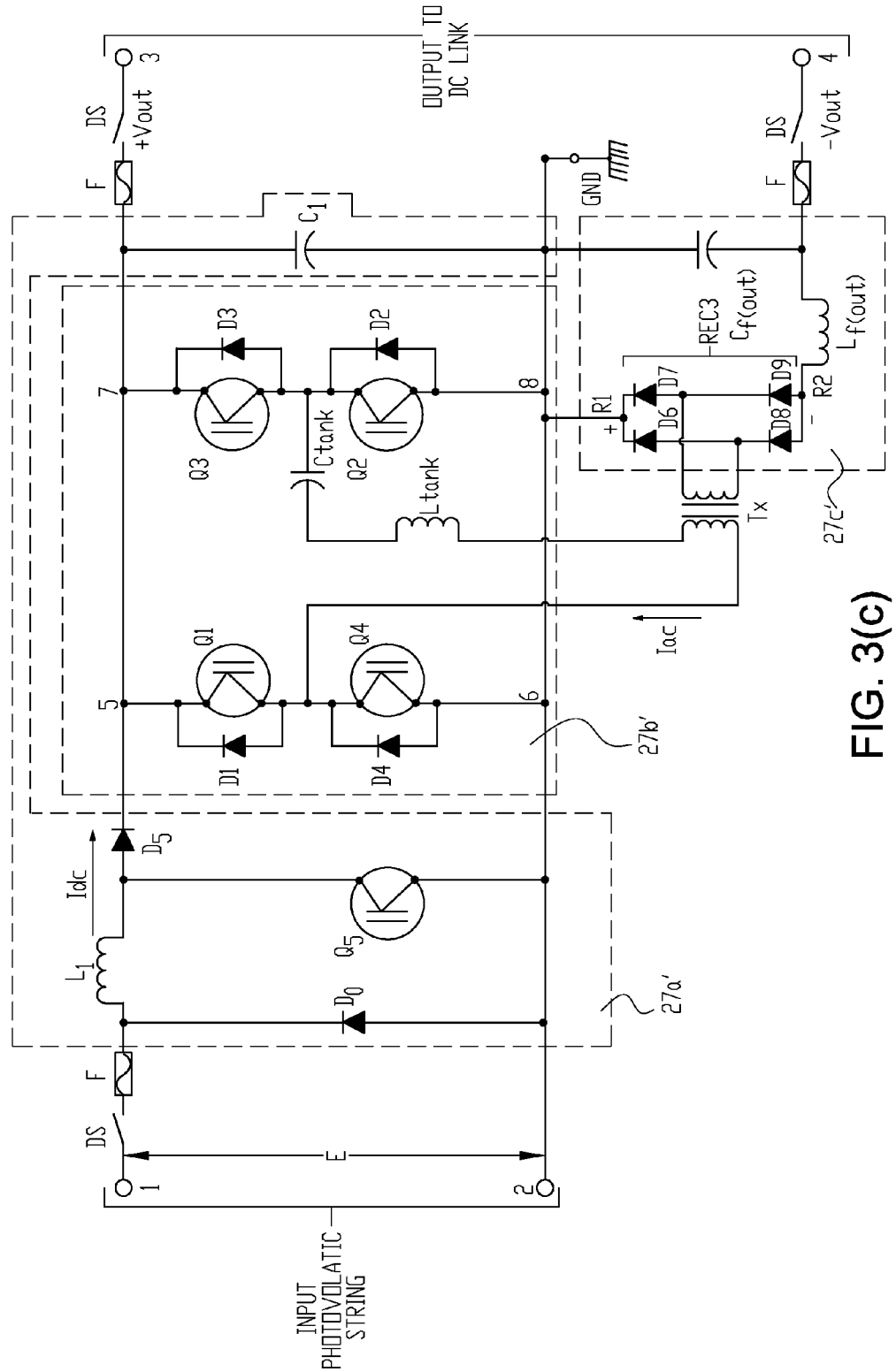
FIG. 3(c) is a diagram of one example of a resonant DC-to-DC converter that can be utilized in the solar power optimizer and transmitter shown in FIG. 2(c).

FIG. 3(c) is one schematic example of an integral step-up DC-to-DC converter 27a that can be utilized in the solar power optimizer and transmitter 27 shown in FIG. 2(c). Each integral step-up DC-to-DC converter comprises: step-up voltage section 27a; series resonant full bridge inverter section 27b' (shown with semiconductor inverter switching devices $Q_1$ through $Q_4$ in this example); and rectifier and filter section 27c'.

Power drawn from the input photovoltaic string source at input terminals 1 and 2 of the SU-DDC in FIG. 3(c) varies with the operating frequency and duty cycle of step-up regulator 27a'. The step-up voltage regulator in this example comprises inductor $L_1$, power transistor $Q_5$ diode $D_5$ and positive output capacitor $C_1$. Also provided is shunt diode $D_0$ which allows current flow in inductor $L_1$ if current is suddenly interrupted. When transistor $Q_5$, which functions as a stored energy transfer device, is conducting (turned on) electric energy is stored in inductor $L_1$. When transistor $Q_5$ is not conducting (turned off), the electric energy stored in inductor $L_1$ is transferred to positive output capacitor $C_1$ that is connected between SU-DDC positive output terminal 3 (+Vout) and electrical ground (GND) output. The output voltage +Vout (relative to electrical ground) is increasing from an input voltage (E) that is in the range of approximately 500 to 800 volts DC to a high voltage (for example 1.25 kV DC) depending upon the duty cycle (D) of conduction of transistor $Q_5$. The same positive output voltage (+Vout) is applied across DC input terminals 5-6 and 7-8 of the step-up DC-to-DC converter's inverter. The input current (Idc) and voltage (E) are measured by processor 20*b* in FIG. 2(*c*), which processor adjusts the duty cycle (that is, the ratio of $Q_5$ time-on to time off) of the step-up voltage regulator so that the maximum power is harvested from each solar photovoltaic module string. The function of disconnect DS is to interrupt the flow of current in the event that the SU-DDC is removed from the system, for example, for maintenance of the SU-DDC.

The combination rectifier and filter section 27*c*' is isolated from the inverter full bridge resonant inverter section 27*b*' of the DC-to-DC converter by a high frequency (in the range of 50 kHz to 100 kHz) transformer Tx. Positive and negative output terminals R1 and R2 of rectifier bridge REC3 (formed from diodes D6-D9) are connected respectively between electrical ground (neutral) and negative output terminal 4 (−Vout) via inductive (shown as inductor $L_{f(out)}$) and capacitive (shown as capacitor $C_{f(out)}$) filter elements. The resonant inverter and rectifier and filter sections may be referred to in combination as a resonant inverter rectified output.

The output currents and voltages on the SU-DDC output terminals (positive terminal 3 (+Vout) and negative terminal 4 (−Vout)) are controlled by the microprocessor 20*b* through variation of the duty cycle D of the transistor $Q_5$ in the step-up voltage regulator 27*a*' and frequency of the series resonant full bridge inverter section 27*b*'. The operating frequency of the resonant inverter used in the DC-to-DC converter is varied near resonance, to adjust the output power magnitude at negative output terminal 4 and equalize it to the power magnitude at positive output terminal 3. In summary, microprocessor 20*b* in this embodiment of the invention controls both the step-up voltage regulator and the DC-to-DC converter. The duty cycle of the step-up voltage regulator is adjusted to operate the photovoltaic string at the maximum power point. The frequency of the resonant inverter used in the DC-to-DC converter is adjusted to equalize the output power magnitude at positive (3) and negative (4) output terminals of the SU-DDC. FIG. 4 illustrates the inverter output current near resonance when the input photovoltaic string voltage can be low and FIG. 5 illustrates the inverter current off-resonance when the photovoltaic string voltage can be high.

Summarizing the above when one integral step-up DC-to-DC converter is used as a single power optimizer, the integral step-up DC-to-DC converter has a power optimizer input connected to the DC output of strings of renewable energy collectors with a means to boost the voltage of the DC output of the strings of renewable energy collectors to an integral step-up DC-to-DC converter positive high voltage DC output referenced to an integral step-up DC-to-DC converter ground potential output. In the above example the means to boost the voltage of the DC output is a step-up voltage regulator. The integral step-up DC-to-DC converter also has a rectified output resonant inverter to generate an integral step-up DC-to-DC converter negative high voltage DC output referenced to the integral step-up DC-to-DC converter ground potential output that is equal in negative magnitude to the positive magnitude of the integral step-up DC-to-DC converter positive high voltage DC output with reference to the integral step-up DC-to-DC converter ground potential output. The integral step-up DC-to-DC converter positive high voltage DC output of the integral step-up DC-to-DC converter is connected to the positive system DC link; the integral step-up DC-to-DC converter negative high voltage DC output of the integral step-up DC-to-DC converter is connected to the negative system DC link; and the integral step-up DC-to-DC converter ground potential output is connected to the common system DC link. A system processor, among other functions, senses and monitors the voltage and current at the string power optimizer input of the integral step-up DC-to-DC converter; provides a means, either directly or indirectly, for controlling the means to boost the voltage of the DC output of the strings of renewable energy connectors in order to operate the plurality of strings of renewable energy collectors at a required operating point such as the maximum power point; and provides a means, either directly or indirectly, for controlling the rectified output resonant inverter of each one of the at least one integral setup-up DC-to-DC converters to adjust the magnitude of an integral step-up DC-to-DC converter output power at the integral step-up DC-to-DC converter positive and negative high voltage DC outputs. The strings of renewable energy collectors connected to the power optimizer input may be a plurality of solar photovoltaic modules or at least one wind turbine driven AC generator having a rectified dc output as described elsewhere herein.

Control of the DC-to-DC converters utilized in FIG. 2(*a*), FIG. 2(*b*), FIG. 3(*a*) and FIG. 3(*b*) may be performed by an inverter controller by varying the commutation frequency of the switching devices utilized in the inverter section of the DC-to-DC converters (which are semiconductors Q1 through Q4 in the present example).

In FIG. 2(*c*) and FIG. 3(*c*) microprocessor 20*b* controls both the step-up voltage regulator and the DC-to-DC converter of the integral step-up DC-to-DC converter. The frequency and duty cycle of the step-up regulator is adjusted to harvest maximum photovoltaic power from a photovoltaic string. The frequency of the resonant DC-to-DC converter is adjusted (magnitude equalization frequency) to equalize the output power magnitude at the positive and negative output terminals of the SU-DDC.

Alternatively control of the DC-to-DC converters may be performed by an inverter controller by varying the duration of conduction of the switching devices ($Q_1$-$Q_4$ in the above example) utilized in the inverter section of the DC-to-DC converters (magnitude equalization duration of conduction) during each period while maintaining fixed near resonant frequency.

Alternatively control of the DC to DC converters may be performed by a combination of varying the commutation frequency of the inverter switching devices and varying the duration of conduction of the inverter switching devices. That is, converter control may be performed by varying the frequency of commutation of the inverter switching devices in a first range and by varying the duration of conduction of the inverter switching devices during each period while maintaining fixed commutation frequency in a second range. The variable frequency range around the resonance frequency, while fixed frequency and variable duration of conduction time of the inverter switching devices is in the range away from resonance.

In an example of the invention utilizing the solar power optimizer and transmitter shown in FIG. 2(*a*), FIG. 2(*b*) or FIG. 2(*c*), each photovoltaic string 31 can comprise between twenty and twenty-five photovoltaic modules. Output of each string is typically 0.5 to 8 amperes DC (at 400 to 780 volts DC) depending on the solar energy system parameters such as solar irradiation, shading, temperature, or environmental deterioration. A cluster of four solar photovoltaic module strings can be connected to a single SPOT as shown in FIG. 2(a), FIG. 2(b) and FIG. 2(c) to produce approximately 800 to 25,000 watts for each SPOT with a four string input.

Figure 6:
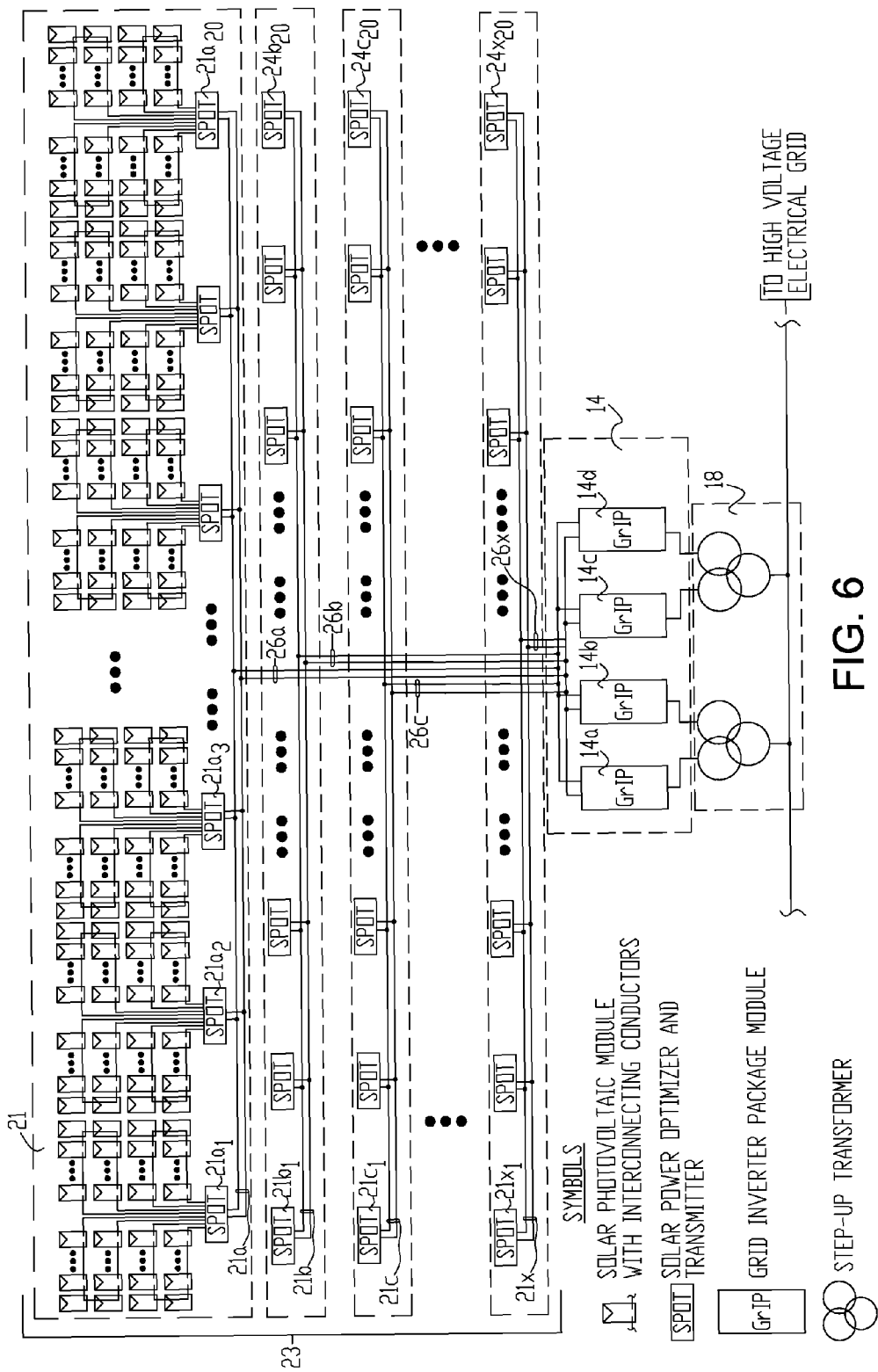
FIG. 6 is one example of the interconnections between a solar farm's solar photovoltaic modules and the solar power optimizers and transmitters utilized in the present invention.

One example of interconnecting a renewable energy utility-size electric power system utilizing solar power optimizers and transmitters of the present invention is illustrated in FIG. 6. A maximum number of solar power optimizers and transmitters, for example twenty, can share each SPOT "horizontal" bus $21a$, $21b$, $21c$ . . . $21x$, shown in FIG. 6. For example SPOT horizontal bus $21a$ has twenty solar power optimizers and transmitters $21a_1$ through $21a_{20}$ connected to the bus. These interconnected twenty solar power optimizers and transmitters, and the photovoltaic modules connected to these twenty solar power optimizers and transmitters comprise photovoltaic energy harvesting array 21 that represents one section of the high voltage, photovoltaic energy collection network 12 diagrammatically illustrated in FIG. 1 and can produce a maximum of 500 kW from solar radiation. Photovoltaic energy harvesting array 21 may comprise four (photovoltaic) strings of photovoltaic modules connected to each of the twenty solar power optimizers and transmitters in array 21, with each photovoltaic string consisting of around 20 to 25 photovoltaic modules connected in series. The combination of the four photovoltaic strings of photovoltaic modules can be identified as a photovoltaic "cluster" consisting of around 80 to 100 modules, so that with 20 solar power optimizers and transmitters in array 21, a total of 1,600 to 2,000 photovoltaic modules are connected to SPOT horizontal bus $21a$. Each of the other photovoltaic energy harvesting arrays that include SPOT horizontal buses $21b$ . . . $21x$ (where "x" is a variable representing the last bus and array comprising photovoltaic collection network 23), can also produce a maximum of 500 kW from solar radiation; photovoltaic strings connected to the solar power optimizes and transmitters in these other arrays are not shown in FIG. 6. Each SPOT horizontal bus is respectively connected to a SPOT "vertical" bus ($26a$, $26b$, $26c$, . . . $26x$ in FIG. 6) to the grid inverter package modules ($14a$, $14b$, $14c$ and $14d$) in the centralized grid synchronized multiphase regulated current source inverter system 14. This practical arrangement will limit the size of the conductors forming each of the SPOT vertical buses to a maximum current capacity of 200 amperes DC, based on a maximum of 10 amperes DC supplied by the array of photovoltaic modules connected to each one of the solar power optimizers and transmitters.

Central control module 16b in FIG. 1 comprises circuitry for communicating among the plurality of solar power optimizers and transmitters, the inverter modules in the centralized grid synchronized multiphase regulated current source inverter system, and for transmitting and receiving power system data such as: collecting data transmitted from each SPOT; communicating with grid inverter package modules $14a$-$14d$, preferably by a secure data link 17 (shown in dashed lines in FIG. 1), such as secure Ethernet; communicating with the three dimensional, visually-oriented, virtual reality display environment if used in a particular example of the present invention, for example via a VIEW computer system; monitoring the high voltage (HV) electrical grid voltage injected by the centralized inverter system into the grid; and monitoring the voltage on the DC link 22 between the harvesting 12 and conversion 14 systems; controlling a set DC input current magnitude delivered to each grid inverter package module where the set DC input current magnitude is set to match the supply of electrical current produced by harvesting 12 system with the demand by the conversion 14 system; and control the phase of the AC current injected into the grid relative to the phase of the AC grid voltage.

In one example of the invention, energy conversion system 14 comprises a plurality of grid inverter package modules. While four grid inverter package modules $14a$-$14d$ are shown for the system example in FIG. 1 and FIG. 6, typically the total of grid inverter package modules ranges from three to forty in other system examples of invention. A grid inverter package module contains circuitry for: converting the grid inverter package rated power (2,500 kW for the example in FIG. 1) from DC to AC; transmitting (reporting) grid inverter package operating parameters to the central control module and the three dimensional, visually-oriented display environment (for example, the VIEW computer); and receiving operating parameters from the central control module, such as the set DC input current magnitude set point and the grid inverter package's output phase angle as described in the previous paragraph. The transmitted operating parameters can include: DC input current to the grid inverter package module; AC output phase currents from a grid inverter package module; AC output phase voltages from the grid inverter package module; AC output power from the grid inverter package module; output frequency from the grid inverter package module; temperature of coolant (if used) in a grid inverter package module cooling subsystem; and selected grid inverter package circuit component temperatures.

In one example of the present invention, the virtual immersion monitoring system is a three dimensional, visually-oriented, virtual reality display environment comprising a VIEW computer system that: collects harvesting system information; presents the collected harvesting information using three dimensional virtual reality as further described below; and forecasts electric power output for injection into the grid on the basis of available string irradiation for a solar energy renewable power system.

Figure 7:
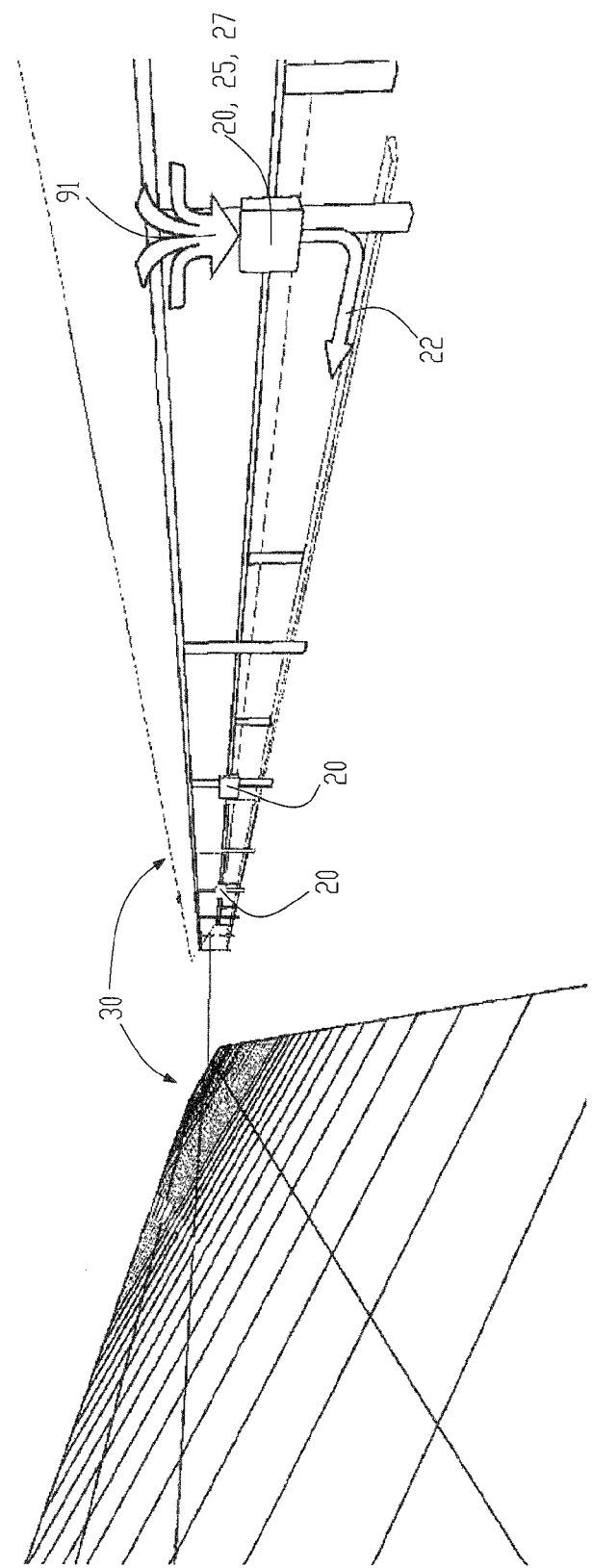
FIG. 7 is a simplified black and white rendition of one three dimensional visual display frame in the three dimensional, visually-oriented, virtual reality display environment of the present invention.

A key element of the virtual immersion monitoring system of the present invention is illustrated in FIG. 7, which is a simplified black and white illustration of a three dimensional image of a partial display of a high voltage, solar photovoltaic energy collection network on a VIEW computer visual display unit. In this illustration photovoltaic modules 30 making up a photovoltaic string are visualized relative to the installed dynamic external environment, including for example, dynamic real time cloud shading of components. Relative location of SPOT 20, 25 or 27 is shown, along with conductors 91 from the photovoltaic strings connected to the inputs of SPOT 20, 25 or 27 and the DC link 22 to which the outputs of SPOT 20, 25 or 27 are connected. Each SPOT can be enclosed in an enclosure approximately 12×12×6 inches with four connections for photovoltaic string input at the top of the enclosure as shown in FIG. 7, and three pass through (except for a SPOT at the end of a SPOT horizontal bus) input and output conductors (positive, negative and neutral (common) as illustrated in FIG. 2(a), FIG. 2(b) or FIG. 2(c) either on the sides of the SPOT enclosure, or the bottom of the SPOT enclosure as illustrated in FIG. 7. Each photovoltaic cluster of photovoltaic modules can be mounted on one structural supporting rack that can also serve as mounting structure (either underneath or on the side of the rack) for the solar power optimizers and transmitters associated with the photovoltaic cluster. All of the color coding elements; cloud visualizations; and other display elements of the visual immersion monitoring system disclosed below are accomplished in the three dimensional image of the power system provided on a VIEW computer visual display unit as an element of the three dimensional, visually-oriented, virtual reality display environment.

For solar power two typical examples of the virtual immersion monitoring and control systems of the present invention are provided. One example uses fixed-tilt tracking photovoltaic arrays and the other uses dual-axis tracking photovoltaic arrays as illustrated by pedestal 32 in FIG. 1. An accurate three-dimensional depiction of the solar farm site is incorporated into the VIEW computer displayed model. The operator's view of the VIEW computer displayed model can be provided on a suitable computer visual output device, such as a video monitor, from a virtual camera view that is moving unconstrained through three dimensional space. The operator has control over movement of the camera through three-dimensional space via a suitable computer input device, such as a handheld controller, joystick or trackball. Movement can be throughout the photovoltaic arrays and can be optionally provided in a predetermined three dimensional space track of the individual components of the solar farm.

The power output of each individual photovoltaic string in the solar farm can be visualized on the VIEW computer visual display unit. Each of photovoltaic strings can be referenced by the SPOT controlling the strings with the SPOT communicating performance data of its associated strings with the central control module. A morning-through-evening daylight transition of the sun over the solar farm can provide varying insolation levels for the photovoltaic modules and will affect the direction in which a dual-axis tracker (if used) will face which is always perpendicular to insolation. In one example of the virtual immersion monitoring system of the present, the magnitudes of power, current and voltage values are represented by a suitable range of color intensities for the images of power system components on the VIEW computer visual display unit, such as photovoltaic modules, solar power optimizers and transmitters, interconnecting electrical conductors, switching components associated with the grid inverter package modules, with the color intensities being a function of the magnitude of power, current and voltage associated with the power system component.

In one example of the invention, color coding of the nominal output of a photovoltaic string of modules is accomplished in shades of a continuous color spectrum that can range from a bright shade of blue for strings operating at full power to darker shades of blue for less than full power, and finally, to black for functional strings generating zero power. The color transition can be linearly related to the nominal power output. Any strings not generating power due to equipment failure can be visually displayed in red to differentiate them from normal strings generating zero power. Power system electrical conductors can be displayed in shades of green to represent the magnitude of current flowing through them with a bright green representing higher current levels and a darker green representing lower current levels. Conductors experiencing a malfunction or fault condition can be shown in red. Enclosures for each SPOT can be displayed in shades of yellow, with higher current levels represented in bright yellow and lower current levels represented in darker yellow. SPOT enclosures with a malfunction or fault condition can be shown in red. Inverter, transformer, grid switchgear and other components can be visually presented in natural colors. An active meter graphic icon can be positioned in a suitable position of the visual display (for example, in the corner of the visual display) with display of real time total electric power generation in suitable units, such as kilowatts. An operator controllable visual display pointing icon can be used by the operator to visually display in the meter graphic icon detailed information of the power output and energy generated by a system component along with a unique identifier, such as a number for the component.

In the virtual immersion monitoring system the image of a cloud can be reconstructed from the shadow it produces on the surface of the photovoltaic panels. The shadow is detected by variable reduction of photovoltaic electric power harvested from a section of the solar farm.

The system can include execution of a prediction algorithm that visually displays the power output of the system at near time in the future (for example, 10 minutes from present in real time) based on cloud movement parameters (cloud direction and velocity) over the site.

In one example model of the invention, visualization can be achieved with dedicated visual layers on the VIEW computer visual display unit so that equipment can be activated (for example, photovoltaic modules made transparent) and the various stages of the power system can be highlighted by turning selected display layers on or off.

Figure 8:
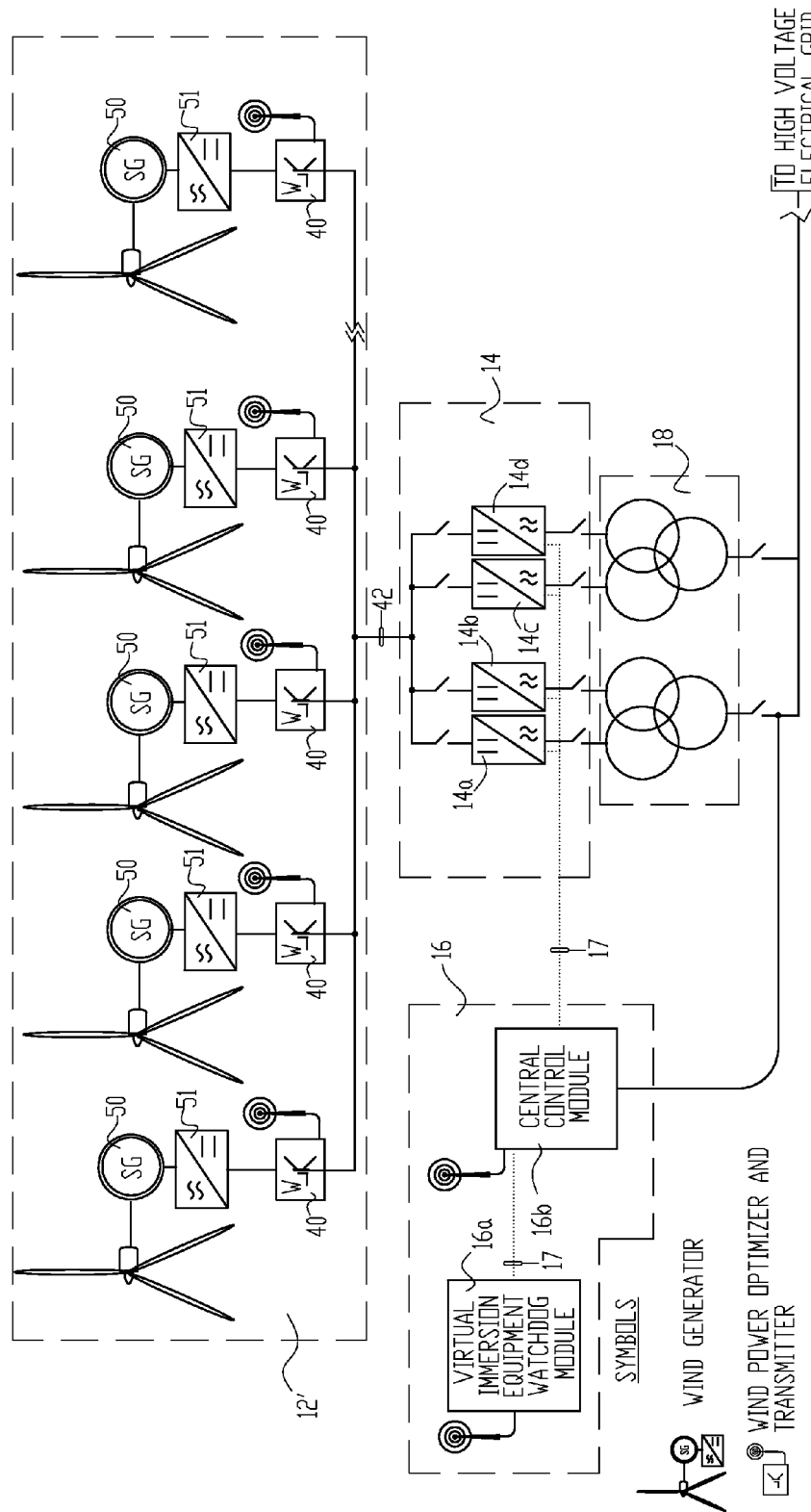
FIG. 8 is a simplified one-line block diagram of one example of a renewable energy, utility-size electric power system for the collection and conversion of wind energy, and a monitoring and control system of the present invention for the power system.

FIG. 8 is a simplified one-line block diagram of one example of a renewable energy, utility-size electric power system for the collection and conversion of wind energy, and a monitoring and control system of the present invention for the power system. The variable frequency AC power produced by a permanent magnet synchronous generator (SG) 50 is rectified by AC-to-DC converter 51 and then applied to the input of a wind power optimizer and transmitter (WPOT) 40. A wind power optimizer and transmitter applies an optimal load to the synchronous generator for operating the wind turbine at the maximum power point value. Wind power optimizer and transmitter 40 is similar to a sun power optimizer and transmitter as described above, except that it typically, but not exclusively, utilizes a single DC-to-DC converter (as shown, for example in FIG. 3(a) or FIG. 3(b)) instead of four DC-to-DC converters (as shown in FIG. 2(a) or FIG. 2(b)) (or other even number of DC-to-DC converters); or utilizes a single integral step-up DC-to-DC converter (as shown, for example in FIG. 3(c)) instead of four integral step-up DC-to-DC converters (as shown in FIG. 2(c)); for a solar power optimizer and transmitter. The output of one or more wind power optimizers and transducers are connected via a high voltage DC link 42 to a centralized grid synchronized multiphase regulated current source inverter system 14 where the system utilizes three or more grid inverter package modules, for example, four such modules 14a-14d as shown in FIG. 8.

The virtual immersion monitoring system, if used in a particular example of the invention, communicates with one or more wind power optimizers and transducers and grid inverter package modules to visually depict operation of the wind farm on a VIEW computer display unit. The three dimensional, visually-oriented display environment includes a three dimensional terrain layer of the wind farm. A generic wind turbine graphic can be used. Depending on the number of turbines, an appropriate number of grid inverter packages will be selected, with each turbine having an output of approximately 1.5 MW, and each grid inverter package having a power rating of 2.5 megawatt (MW). The visualization of the virtual immersion monitoring system can be aligned so that the grid inverter packages are in the foreground, and the turbines and connections to the inverter system are clearly visible. Transformers can be located next to the inverters outside of a building in which the inverters are located. The visualization of a wind turbine's output can be a power meter graphic icon with at least real time power output and optionally historical data in numeric or graphic form layered on the three dimensional, visually-oriented display environment.

Elements of the virtual immersion system described above for solar energy systems also apply to a virtual immersion system for wind energy system unless the element is specifically addressed to a component or function uniquely associated with solar energy and not wind energy.

The present invention has been described in terms of preferred examples and embodiments. Equivalents, alternatives and modifications, aside from those expressly stated, are possible and within the scope of the invention.

The invention claimed is:

1. A renewable energy, utility-size electric power system comprising:
 a high voltage, renewable energy harvesting network comprising:
 a plurality of strings of renewable energy collectors, each of the plurality of strings of renewable energy collectors having a DC output;
 at least one integral step-up DC-to-DC converter, one or more of the at least one integral step-up DC-to-DC converters comprising one of a plurality of renewable energy power optimizers and transmitters, each of the at least one integral step-up DC-to-DC converters comprising:
  at least one string power optimizer input connected to the DC output of at least one of the plurality of strings of renewable energy collectors, the at least one string power optimizer input having a means to boost a DC output voltage of the DC output of the at least one of the plurality of strings of renewable energy collectors to an integral step-up DC-to-DC converter positive high voltage DC output having a positive high voltage DC magnitude, the integral step-up DC-to-DC converter positive high voltage DC output referenced to an integral step-up DC-to-DC converter ground potential output; and
  a rectified output resonant inverter to generate an integral step-up DC-to-DC converter negative high voltage DC output referenced to the integral step-up DC-to-DC converter ground potential output, the integral step-up DC-to-DC converter negative high voltage DC output having a negative high voltage DC magnitude equal in negative magnitude to the positive high voltage DC magnitude of the integral step-up DC-to-DC converter positive high voltage DC output referenced to the integral step-up DC-to-DC converter ground potential output;
 a system DC link comprising a positive, negative and common system DC links, the integral step-up DC-to-DC converter positive high voltage DC output of each of the at least one integral step-up DC-to-DC converters connected to the positive system DC link of the system DC link, the integral step-up DC-to-DC converter negative high voltage DC output of each of the at least one integral step-up DC-to-DC converters connected to the negative system DC link of the system DC link; and the integral step-up DC-to-DC converter ground potential output of each of the at least one integral step-up DC-to-DC converters connected to the common system DC link of the system DC link;
 a processor sensing and monitoring a power optimizer input voltage and a power optimizer input current at the at least one string power optimizer input of each of the at least one integral step-up DC-to-DC converters, the processor providing a means of controlling the boost DC output voltage of the DC output of the at least one of the plurality of strings of renewable energy collectors, the processor providing a means for controlling the rectified output resonant inverter of each one of the at least one integral step-up DC-to-DC converters; and
 a centralized grid synchronized multiphase regulated current source inverter system having a plurality of grid inverter package modules, each of the grid inverter package modules having an input connected to the system DC link.

2. The renewable energy, utility-size electric power system of claim 1 wherein the means for controlling the rectified output resonant inverter comprises a rectified output resonant inverter controller to select a magnitude equalization commutation frequency to control the switching of each one of a plurality of inverter switching devices in the rectified output resonant inverter of each of the at least one integral step-up DC-to-DC converters responsive to the magnitude equalization commutation frequency whereby the positive high voltage DC magnitude and the negative high voltage DC magnitude of an integral step-up DC-to-DC converter output power at the integral step-up DC-to-DC converter positive and negative high voltage DC outputs are equalized.

3. The renewable energy, utility-size electric power system of claim 1 wherein the means for controlling the rectified output resonant inverter comprises a rectified output resonant inverter controller to select a combination of a magnitude equalization commutation frequency and a magnitude equalization duration of conduction of a plurality of inverter switching devices in the rectified output resonant inverter of each of the at least one integral step-up DC-to-DC converters responsive to the magnitude equalization commutation frequency and magnitude equalization duration of conduction whereby the positive high voltage DC magnitude and the negative high voltage DC magnitude of an integral step-up DC-to-DC converter output power at the integral step-up DC-to-DC converter positive and negative high voltage DC outputs are equalized.

4. The renewable energy, utility-size electric power system of claim 1 wherein the means to boost the DC output voltage of the DC output of the at least one of the plurality of strings of renewable energy collectors comprises a step-up voltage regulator, and the means for controlling the rectified output resonant inverter of each one of the at least one integral step-up DC-to-DC converters comprises a rectified output resonant inverter controller to select a magnitude equalization commutation frequency to control the switching of each one of a plurality of inverter switching devices in the rectified output resonant inverter of each of the at least one integral step-up DC-to-DC converters responsive to the magnitude equalization commutation frequency whereby the positive high voltage DC magnitude and the negative high voltage DC magnitude of an integral step-up DC-to-DC converter output power at the integral step-up DC-to-DC converter positive and negative high voltage DC outputs are equalized.

5. The renewable energy, utility-size electric power system of claim 1 wherein the means to boost the DC output voltage of the DC output of the at least one of the plurality of strings of renewable energy collectors comprises a voltage regulator controller to control a duty cycle of an energy storage transfer switching device in the voltage regulator of each of the at least one integral step-up DC-to-DC converters to operate the plurality of strings of renewable energy collectors at a maximum power point.

6. The renewable energy, utility-size electric power system of claim 1 wherein each one of the plurality of strings of renewable energy collectors comprises a plurality of solar photovoltaic modules.

7. The renewable energy, utility-size electric power system of claim 6 wherein the at least one integral step up DC-to-DC converter comprises a combination of four integral step-up DC-to-DC converters; and a transceiver, the transceiver connected to an antenna for transmitting and receiving of a plurality of high voltage, renewable energy harvesting network data and a plurality of centralized grid synchronized multiphase regulated current source inverter system data.

8. The renewable energy, utility-size electric power system of claim 1 further comprising a central control system, the central control system comprising:
a means for communicating among the plurality of renewable energy power optimizers and transmitters and the plurality of grid inverter package modules; and
a means for transmitting and receiving a plurality of high voltage, renewable energy harvesting network data and a plurality of centralized grid synchronized multiphase regulated current source inverter system data.

9. The renewable energy, utility-size electric power system of claim 1 further comprising:
a virtual immersion monitoring system and a central control system for monitoring and controlling the high voltage, renewable energy harvesting network and the centralized grid synchronized multiphase regulated current source inverter system.

10. The renewable energy, utility size electric power system of claim 9 wherein the virtual immersion monitoring system comprises a virtual immersion equipment watchdog computer system for collecting a plurality of high voltage, renewable energy harvesting network data and a plurality of centralized grid synchronized multiphase regulated current source inverter system data; visual displaying of the plurality of high voltage, renewable energy harvesting network data and the plurality of centralized grid synchronized multiphase regulated current source inverter system data in a three dimensional, visually-oriented virtual reality display environment; and forecasting an electric power output from the high voltage, renewable energy harvesting network for injection into a high voltage electrical grid based on available irradiation of the plurality of strings of renewable energy collectors.

11. The renewable energy, utility-size electric power system of claim 1 wherein each one of the plurality of strings of renewable energy collectors comprises a plurality of wind turbine driven AC generators having a rectified dc output and the processor controlling each of the at least one integral step-up DC-to-DC converters to a maximum power point.

12. A method of optimizing a harvesting, converting, monitoring and controlling renewable energy from an utility-size renewable energy system comprising:
harvesting renewable energy from a plurality of strings of renewable energy collectors, each of the plurality of renewable energy collectors having a DC output;
step-up voltage regulating the DC output of each of the plurality of renewable energy collectors to generate a positive high voltage DC optimized output from an integral step-up DC-to-DC converter with the positive high voltage DC optimized output referenced to a common ground step-up DC-to-DC converter ground potential output;
resonant inverting and rectifying the positive high voltage DC optimized output to generate a negative high voltage DC optimized output from the integral step-up DC-to-DC converter with the negative high voltage DC optimized output referenced to the common ground step-up DC-to-DC converter ground potential output; and
delivering a positive and negative high voltage DC output power referenced to the common ground step-up DC-to-DC converter ground potential from the positive and negative high voltage DC optimized outputs to a centralized grid synchronized multiphase regulated current source inverter system by a system DC link.

13. The method of claim 12 wherein the step of step-up voltage regulating the DC output of each of the plurality of renewable energy collectors further comprises controlling a duty cycle of an energy transfer switching device to operate the plurality of strings of renewable energy collectors at a maximum power point for an optimized output.

14. The method of claim 12 wherein the step of resonant inverting and rectifying the positive high voltage DC optimized output further comprises adjusting a resonant inverting frequency to equalize the positive and negative high voltage DC optimized output power.

15. The method of claim 14 further comprising the steps of:
virtual immersion monitoring of the utility-size renewable energy system in a three dimensional visually-oriented virtual reality display environment; and
centrally controlling the utility-size renewable energy system and the centralized grid synchronized multiphase regulated current source inverter system in communication with the three dimensional, visually-oriented virtual reality display environment.

16. A renewable energy, utility-size electric power system comprising:
a high voltage, renewable energy harvesting network comprising:
a plurality of strings of renewable energy collectors, each of the plurality of strings of renewable energy collectors having a DC output;
at least one integral step-up DC-to-DC converter, one or more of the at least one integral step-up DC-to-DC converters comprising one of a plurality of renewable energy power optimizers and transmitters, each of the at least one integral step-up DC-to-DC converters comprising:
an integral step-up voltage regulator connected to the DC output of at least one of the plurality of strings of renewable energy collectors to boost the DC output of the at least one of the plurality of strings of renewable energy collectors to an integral step-up DC-to-DC converter positive high voltage DC output referenced to an integral step-up DC-to-DC converter ground potential output;
a resonant inverter having a resonant inverter input connected to the integral step-up DC-to-DC converter positive high voltage DC output referenced to the integral step-up DC-to-DC converter ground potential output;
a rectified resonant inverter output having an integral step-up DC-to-DC converter negative high voltage DC output referenced to the integral step-up DC-to-DC converter ground potential output equal in magnitude and of reverse polarity to the integral step-up DC-to-DC converter positive high voltage DC output, the rectified resonant inverter output electrically isolated from the resonant inverter input;
a system DC link comprising a positive, negative and common system DC links, the integral step-up DC-to-DC converter positive high voltage DC output of each of the at least one integral step-up DC-to-DC converters connected to the positive system DC link of the system DC link, the integral step-up DC-to-DC converter negative high voltage DC output of each of the at least one integral step-up DC-to-DC converters connected to the negative system DC link of the system DC link; and the integral step-up DC-to-DC converter ground potential output of each of the at least one integral step-up DC-to-DC converters connected to the common system DC link of the system DC link;

a processor for: sensing and monitoring the voltage and current at a string inverter input of each of the at least one integral step-up DC-to-DC converters; controlling the integral step-up voltage regulator of each of the at least one integral step-up DC-to-DC converters to operate the plurality of strings of renewable energy collectors at a maximum power point; and controlling the resonant inverter of each one of the at least one integral step-up DC-to-DC converters to equalize a magnitude of an integral step-up DC-to-DC converter output power at the integral step-up DC-to-DC converter positive and negative high voltage DC outputs; and a centralized grid synchronized multiphase regulated current source inverter system having a plurality of grid inverter package modules, each of the grid inverter package modules having an input connected to the system DC link.

17. The renewable energy, utility-size electric power system of claim 16 wherein the integral step-up voltage regulator further comprises an energy transfer switching device for alternatively inductively storing a reserve energy or transferring the reserve energy to a capacitive element connected across the resonant inverter input to maintain the integral step-up DC-to-DC converter positive high voltage DC output.

18. The renewable energy, utility-size electric power system of claim 16 further comprising a resonant inverter controller to select a magnitude equalization commutation frequency to control the switching of each one of a plurality of inverter switching devices in the resonant inverter of each of the at least one integral step-up DC-to-DC converters responsive to the magnitude equalization commutation frequency whereby the magnitude of the integral step-up DC-to-DC converter output power at the integral step-up DC-to-DC converter positive and negative high voltage DC outputs are equalized.

19. The renewable energy, utility-size electric power system of claim 16 further comprising:

a virtual immersion monitoring system and a central control system for monitoring and controlling the high voltage, renewable energy harvesting network and the centralized grid synchronized multiphase regulated current source inverter system.

20. The renewable energy, utility size electric power system of claim 19 wherein the virtual immersion monitoring system comprises a virtual immersion equipment watchdog computer system for collecting a plurality of high voltage, renewable energy harvesting network data and a plurality of centralized grid synchronized multiphase regulated current source inverter system data; visual displaying of the plurality of high voltage, renewable energy harvesting network data and the plurality of centralized grid synchronized multiphase regulated current source inverter system data in a three dimensional, visually-oriented virtual reality display environment; and forecasting an electric power output from the high voltage, renewable energy harvesting network for injection into a high voltage electrical grid based on available irradiation of the plurality of strings of renewable energy collectors.

* * * * *